(12) United States Patent
Pollock et al.

(10) Patent No.: US 8,039,374 B2
(45) Date of Patent: Oct. 18, 2011

(54) METHOD FOR LOW TEMPERATURE ION IMPLANTATION

(75) Inventors: John D. Pollock, Rowley, MA (US); Zhimin Wan, Sunnyvale, CA (US); Erik Collart, North Andover, MA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 0 days.

(21) Appl. No.: 12/727,573

(22) Filed: Mar. 19, 2010

(65) Prior Publication Data
US 2011/0229987 A1 Sep. 22, 2011

(51) Int. Cl.
*H01L 21/425* (2006.01)
(52) U.S. Cl. . 438/514; 438/509; 438/905; 257/E21.043; 257/E21.077; 257/E21.16; 257/E21.248; 257/E21.269
(58) Field of Classification Search ............... 438/509, 438/514, 535, 905; 257/E21.043, 77, 16, 257/248, 269
See application file for complete search history.

(56) References Cited

U.S. PATENT DOCUMENTS 5,244,820 A * 9/1993 Kamata et al. ............... 438/514
7,868,306 B2 * 1/2011 Ramappa ................ 250/492.21
* cited by examiner

*Primary Examiner* — David Nhu
(74) *Attorney, Agent, or Firm* — Rosenberg, Klein & Lee

(57) ABSTRACT

Techniques for low temperature ion implantation are provided to improve throughput. Specifically, the pressure of the backside gas may temporarily, continually or continuously increase before the starting of the implant process, such that the wafer may be quickly cooled down from room temperature to be essentially equal to the prescribed implant temperature. Further, after the vacuum venting process, the wafer may wait an extra time in the load lock chamber before the wafer is moved out the ion implanter, in order to allow the wafer temperature to reach a higher temperature quickly for minimizing water condensation on the wafer surface. Furthermore, to accurately monitor the wafer temperature during a period of changing wafer temperature, a non-contact type temperature measuring device may be used to monitor wafer temperature in a real time manner with minimized condensation.

20 Claims, 4 Drawing Sheets

METHOD FOR LOW TEMPERATURE ION IMPLANTATION

BACKGROUND OF THE INVENTION

1. Field of the Invention

The present invention relates to ion implantation, and more especially, to –low temperature ion implantation.

2. Background of the Related Art

Low temperature ion implantation is a new application of ion implantation. It has been discovered that a relatively low wafer temperature during ion implantation is advantageous for the formation of shallow junctions, especially ultra-shallow junctions, which are more and more important for continued miniaturization of semiconductor devices. Besides, it also has been proven to be useful for enhancing the yield of the ion implantation.

At the start of the current low temperature ion implantation, a wafer is moved from an environment, such as an atmosphere environment, into an implanter. As shown in FIG. 1a, before the implant process is started, a cooling process (from $t_c$ to $t_i$) cools the wafer temperature from an environment temperature $(T_R)$ of about 15~25° C. to a prescribed implant temperature $(T_P)$ (or to be essentially equal to the prescribed implant temperature), which usually is lower than the freezing point of water and generally is about –15~–25° C. As usual, the prescribed implant temperature represents the setting temperature of an E-chuck, which is used to hold the wafer. Herein, the wafer can be cooled at least in a cassette outside the implanter, in a loadlock chamber of the implanter, in a chamber of the implanter, and so on.

In general, as shown in FIG. 1b, a backside gas with a constant pressure $(P_0)$ is applied to cool the wafer and it requires several seconds (even minutes) to cool down the wafer from the environment temperature $(T_R)$ to the prescribed implant temperature $(T_P)$. After that, the backside gas with the constant pressure is still applied to cool the wafer during the implant process. Referring still to FIG. 1a, during the implant process (from $t_i$ to $t_h$) of the wafer, the wafer is heated by the ion beam energy and cooled by a cooling mechanism, such as a backside cooling gas. Usually, to keep the wafer to have appropriate implant quality in the low temperature ion implantation, the pressure of the backside gas is properly adjusted to ensure the wafer temperature is always equal to the prescribed implant temperature $(T_P)$ or at least is not higher an upper-limited temperature $(T_L)$ during the implant process. Herein, the rise curve of the wafer temperature during the implant process (from $t_i$ to $t_h$) may be linear or non-linear, and the rise curve shown in FIG. 1a is only a sketch. On the other hand, if the upper-limited temperature $(T_L)$ is close to the prescribed implant temperature $(T_P)$, as shown in FIG. 1a', the wafer temperature during the implant process (from $t_i$ to $t_h$) may be thought of as constant.

After finishing the implant process, referring still to FIG. 1a or FIG. 1a', a heating process (from $t_h$ to $t_f$) proceeds to heat the implanted wafer until the wafer has an environment temperature $(T_R')$. Herein the environment temperature $(T_R')$ may correspond to the atmosphere environment temperature, so that the difference between the implanted wafer temperature, which will be moved out of the ion implanter immediately, and the environment temperature is decreased. Hence, owing to the decreased temperature difference, the water condensation problem on the wafer surface induced by the temperature difference may be avoided or minimized.

In general, after the implant process, the implanted wafer is transferred into a loadlock chamber in a vacuum state to proceed with the heating process. As usual, to avoid any potential contamination, the implanted wafer is not heated by an active heat source but is heated by thermal radiation between the wafer and the load-lock chamber walls. After the temperature of the implanted wafer reaches the environment temperature $(T_R')$, the load-lock chamber is vented and the implanted wafer is moved outside the loadlock chamber immediately. Herein, owing to the low efficiency of the radiation heat transfer mechanism, it requires some seconds (even some minutes) to heat up the implanted wafer from the prescribed implant temperature $(T_P)$ to the environment temperature $(T_R')$.

Therefore, both the cooling process and heating process are time-consuming, so that the wafer throughput of the low temperature ion implantation is limited.

SUMMARY OF THE INVENTION

In order to solve the foregoing problems, this invention provides a method for low temperature ion implantation with improved wafer throughput.

A feature of the invention is that the operation of the cooling mechanism is stronger in the cooling process and weaker in the implant process. Hence, the cooling rate can be enhanced and then the required period of the cooling process can be shortened. Accordingly, a low temperature ion implant may proceed in accordance with the following steps in sequence. Firstly, a cooling process proceeds to cool a wafer, wherein a temperature adjustment device is operated in a first state so that a temperature of the wafer is changed from a first temperature to a second temperature. Then, implant the wafer in an implantation chamber, wherein a temperature adjustment device is operated in a second state so that a temperature of the wafer is essentially between the second temperature and a third temperature higher than the second temperature. Next, transfer the implanted wafer into a load lock chamber. Finally, vent vacuum in the loadlock chamber and then move the wafer outside the loadlock chamber. Herein, as an example, the temperature adjustment device applies a gas to cool the wafer, the first state corresponds to a first pressure of the gas and the second state corresponds to a second pressure of the gas, wherein the first pressure is higher than the second pressure.

Another feature of the invention is that the wafer is not immediately moved out the ion implanter after a vacuum venting process is finished. Hence, the wafer temperature may be increased quickly inside the ion implanter before the wafer is moved into the outside environment. Accordingly, a low temperature ion implant may proceed in accordance with the following steps in sequence. Firstly, a cooling process proceeds to cool a wafer from a first temperature to a second temperature. Next, implant the wafer in an implantation chamber as a temperature of the wafer is essentially between the second temperature and a third temperature higher than the second temperature; then, transfer the implanted wafer into a load-lock chamber in a vacuum state, wherein the load-lock chamber has at least an atmosphere door as an interface between the load-lock chamber and an outside environment, wherein the atmosphere door is closed when the load-lock chamber in the vacuum state. And then, proceed with a vacuum venting process in the load-lock chamber and wait an extra time after the vacuum venting process until the wafer has a third temperature. Finally, open the atmosphere door and move the wafer outside the load-lock chamber.

Still another feature of the invention is that a temperature measurement device is used to monitor the wafer temperature. Hence, to change the operation of the cooling mechanism and to open the atmosphere door can be more precisely controlled. Of course, to minimize potential contamination, a non-contact type temperature measuring device may be used.

Significantly, the invention never limits the practical details about the operation of the cooling apparatus in the cooling process and the operation of the cooling apparatus in the implant process. The only limitation is that the operation of the cooling apparatus is higher (stronger) in the cooling process but is lower (weaker) in the implantation process. Similarly, the invention never limits the practical period of the extra waiting time. The only limitation is that the wafer is not moved out the ion implanter immediately after the vacuum venting process.

DETAILED DESCRIPTION OF THE INVENTION

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

Figure 2A:
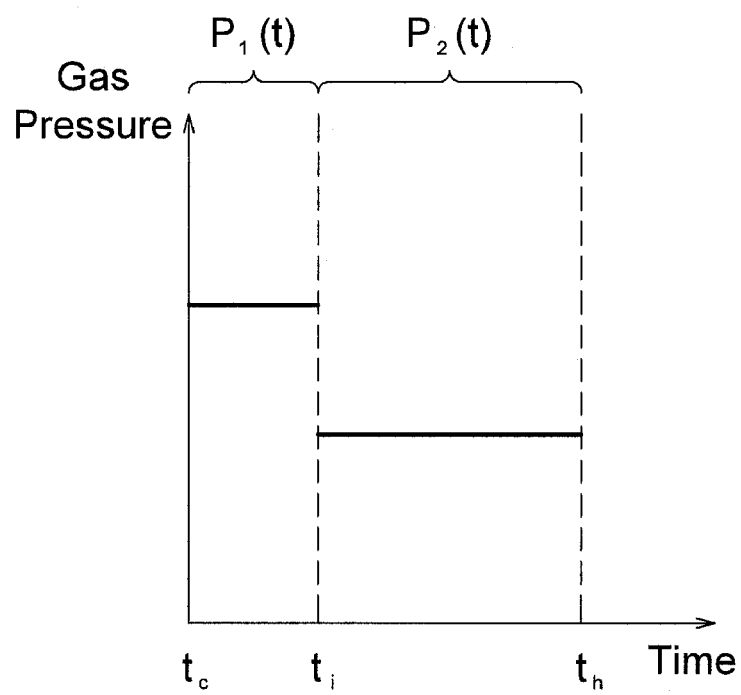
FIG. 2a and FIG. 2b are two diagrams respectively illustrating relations between the gas pressure and the time during the cooling process and the implant process in accordance with two embodiments of the present invention.
Figure 2B:
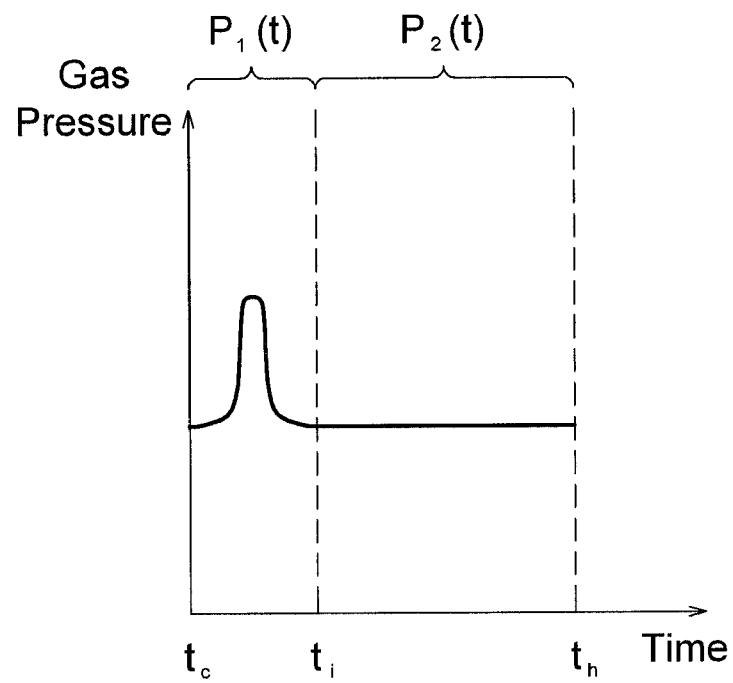
Figure 2C:
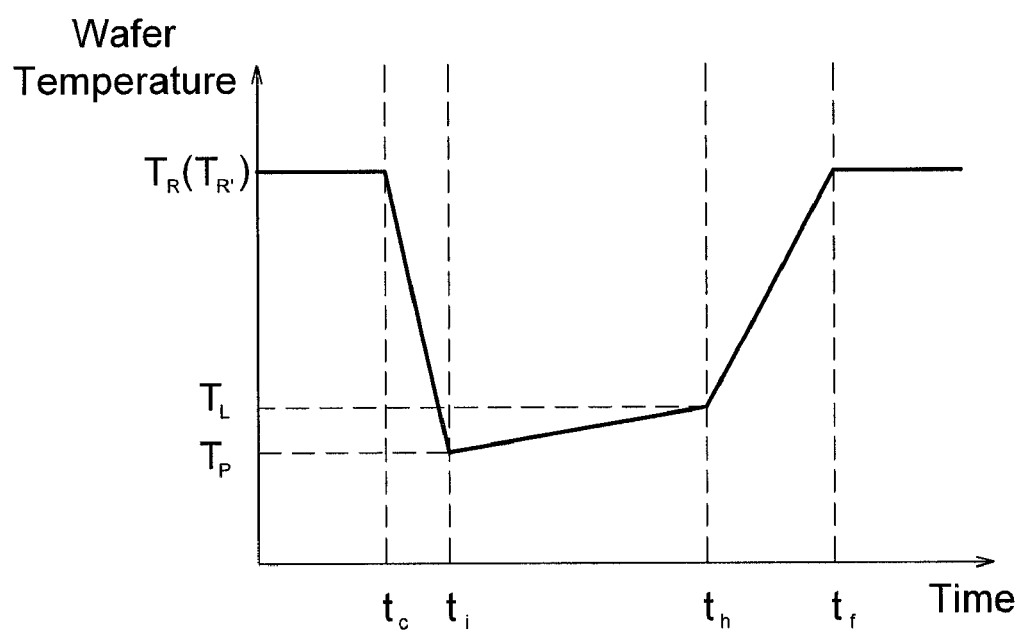
FIG. 2c is a diagram illustrating relation between the wafer temperature and the time in accordance with an embodiment of the present invention.

In one embodiment, the temperature adjustment device applies a gas to cool the wafer, wherein the gas is a backside gas to take heat away the wafer from the backside of the wafer. As shown on FIG. 2a, a first state from time of $t_c$ to $t_i$ is that the temperature adjustment device applies a gas with a first pressure ($P_1$), and a second state from time of $t_i$ to $t_h$ is that the temperature adjustment device applies a gas with a second pressure ($P_2$). Herein, the first pressure is higher than the second pressure and the first pressure is a constant. Further, the first pressure may be variable with time, or as shown in FIG. 2b, the first pressure is temporarily increased to be higher than the second pressure. In other non-illustrated embodiment, the first pressure may be temporarily varied, continually varied or continuously varied during the cooling process, when the first pressure is higher than the second pressure. As shown in FIG. 2c, in the above embodiments, the required time of the cooling process is reduced because the higher gas pressure during the cooling process may more efficiently take the heat away. Herein, the upper-limited temperature ($T_L$) is assumed to be slightly higher than the prescribed implant temperature ($T_P$) and the wafer temperature variation is assumed to be linear, although they are independent on the main characteristics of this embodiment.

Clearly, the higher the gas pressure is, the faster the wafer temperature is reduced. Hence, the essential mechanism of these embodiments is that the gas pressure is higher during the cooling process but is lower during the implant process. In other words, how the gas pressure is varied during the cooling pressure is not limited. For example, when the average gas pressure during the cooling process is higher than the fixed gas pressure in the implant process, it is optional that the gas pressure is lower than the fixed gas pressure during some portions of the cooling process.

Figure 1A:
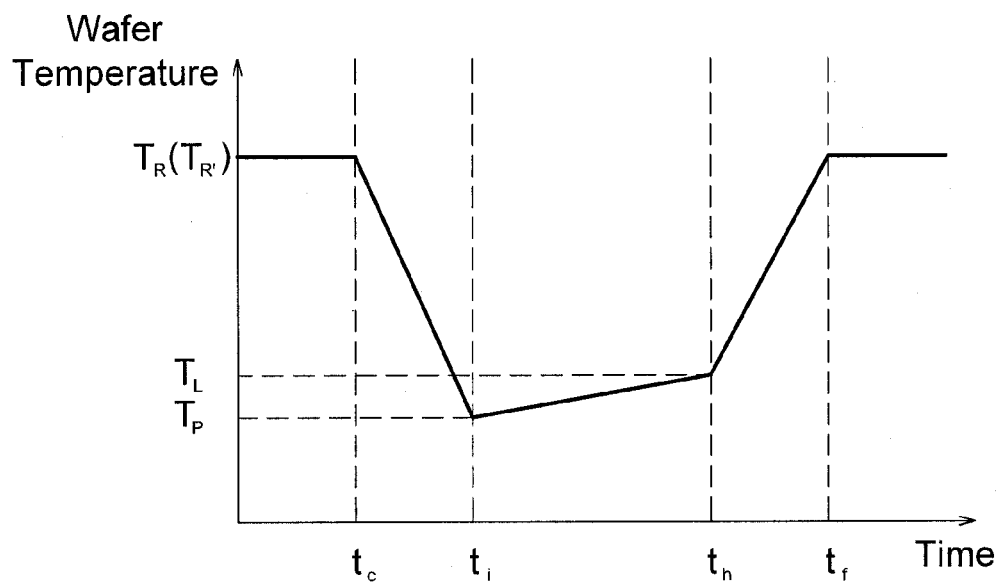
FIG. 1a and FIG. 1a' are two diagrams illustrating conventional relations between the wafer temperature and the time during the low temperature ion implantation step.
Figure 1A:
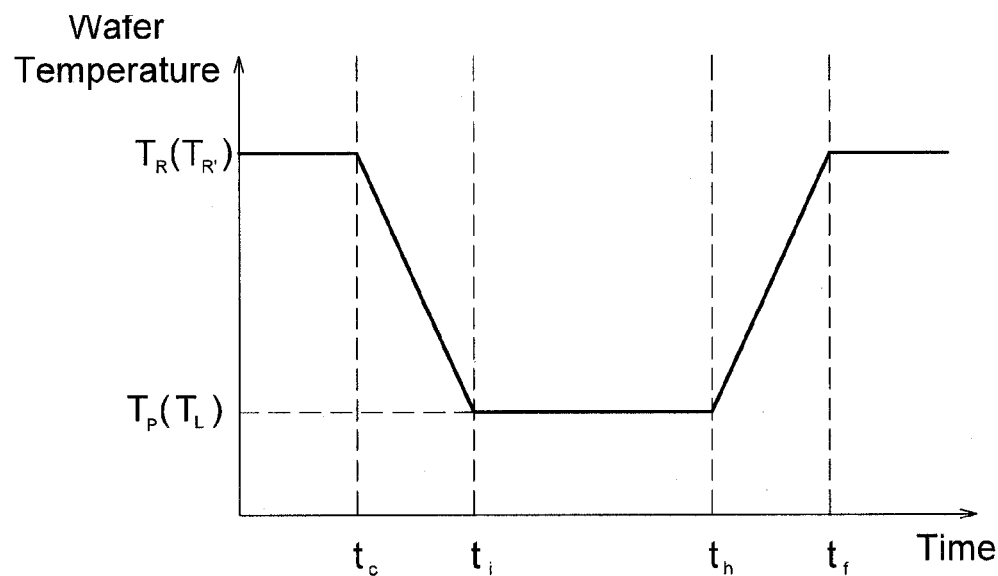
Figure 1B:
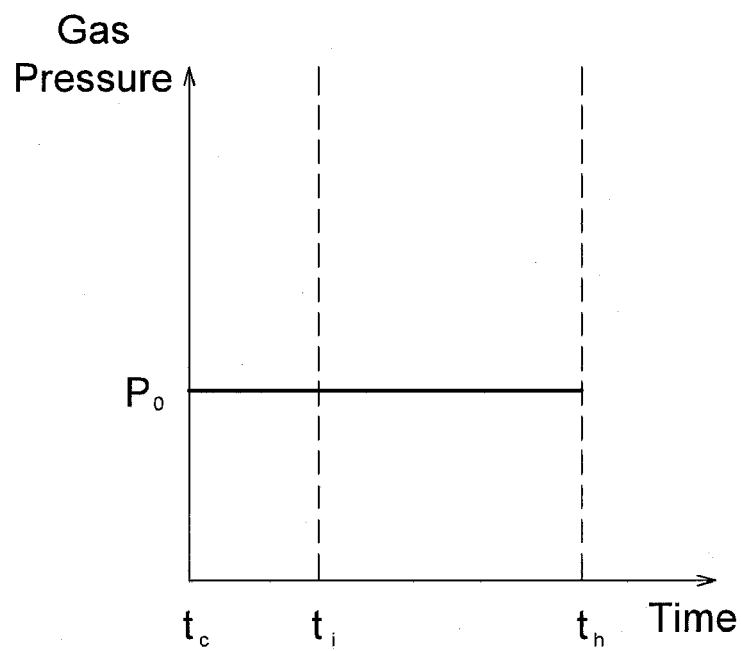
FIG. 1b is a diagram illustrating a conventional relation between the gas pressure and the time during the cooling process and the implant process.

To compare with the conventional prior art, the main difference between the above embodiment(s) and the conventional prior art is the gas pressure in the cooling process. Reasonably, the above embodiment(s) use higher gas pressure in the cooling process, and then the decreased rate of the wafer temperature is higher in the cooling process. Therefore, by comparing FIG. 2c with FIG. 1a, the above embodiments can effectively shorten the required period of the cooling process to reduce the wafer temperature from environment temperature to the required implant temperature.

Figure 3:
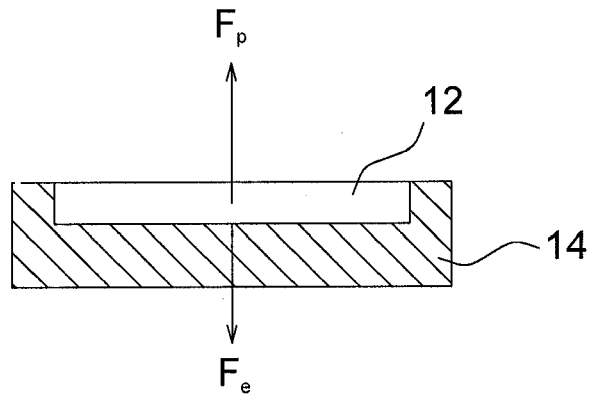
FIG. 3 is a diagram illustrating different forces applied to a wafer in accordance with an embodiment of the present invention.

It is noted that the higher gas pressure will cause a higher pushing force ($F_p$), which attempts to push the wafer 12 away, as shown in FIG. 3. In general, the wafer 12 is held by using an E-chuck 14, which provides an electrostatic force ($F_e$) to the wafer. The electrostatic force ($F_e$) is an attracting force to cause the wafer 12 to be held on the E-chuck 14 stably. Hence, to avoid the unacceptable damage or displacement of the wafer 12, the gas pressure has to be balanced with the electrostatic force. In other words, the pushing force ($F_p$) from the gas pressure has to be equal to or less than the attracting force. Further, when the higher gas pressure is needed to speed up the cooling process, the electrostatic force ($F_e$) should be correspondingly increased to prevent unacceptable movement or damage of the wafer 12.

Of course, depending on the design of the ion implanter, sometimes the gravity force on the wafer also is a portion of the repulsing force or the attracting force. However, the gravity force is a constant and may be viewed as a background only. Further, although back side gas cooling is the commonly used cooling mechanism, the invention is not limited by the practical details of the cooling mechanism.

In another embodiment, the temperature adjustment device is a temperature controlled chuck capable of holding the wafer. Hence, the temperature adjustment device operated in the first state means that the temperature controlled chuck is adjusted to have a lower working temperature, and the temperature adjustment device operated in the second state means that the temperature controlled chuck is adjusted to have a higher working temperature. According to the different working temperature of a temperature controlled chuck, a wafer held by the temperature controlled chuck will have a different wafer temperature, especially a different changing rate of wafer temperature, during the cooling process and the implant process.

In general, the low temperature ion implantation process is divided into at least an implant process, a cooling process to cool down the wafer before the implant process and a heating process to heat up the wafer after the implant process. In the present invention, because the period of the cooling process is shortened, the throughput of the low temperature ion implantation step is improved. Moreover, as an example, to precisely adjust the pressure of the backside gas as the wafer is cooled to the required temperature for properly implanting the wafer, a temperature measurement device is optionally configured near the wafer to detect the wafer temperature so let the wafer temperature may be dynamically monitored in a real-time manner. The temperature measurement device may be a thermocouple, an infrared thermometer, a non-contact type temperature measurement device or any combination thereof. Moreover, to avoid any potential contamination, such as particle contamination from the interaction between the temperature measurement device and the ion beam, a non-contact type temperature measurement device is an option.

Figure 4:
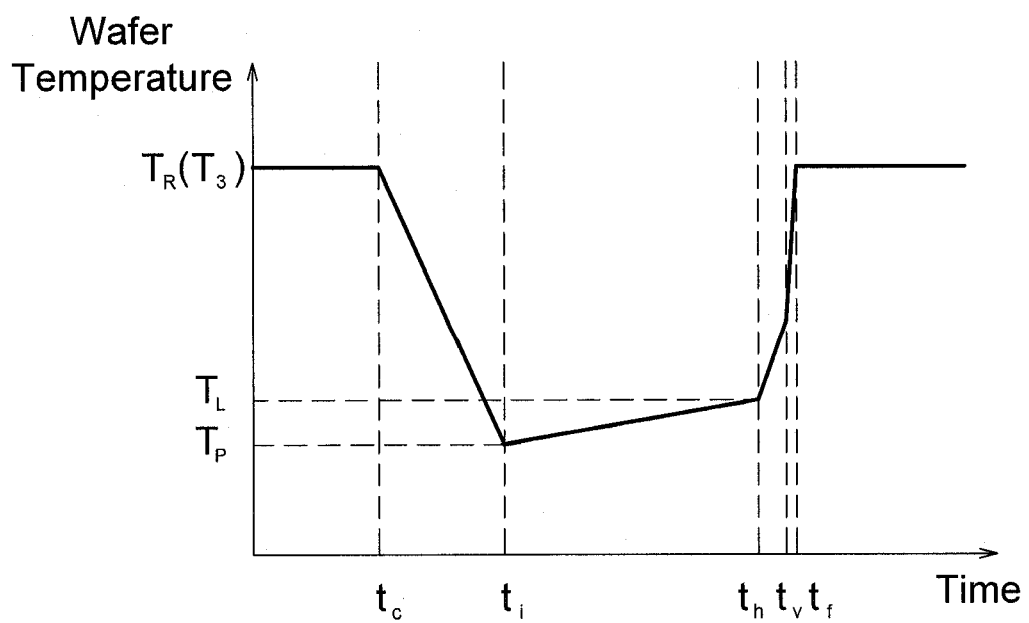
FIG. 4 is a diagram illustrating a relation between the wafer temperature and the time during the low temperature ion implantation step in accordance with an embodiment of the present invention.

On the other hand, another embodiment is a method for low temperature ion implantation, please refer to FIG. 4. Firstly, a cooling process proceeds to cool a wafer from a first temperature to a second temperature, wherein the first temperature is room temperature ($T_R$). Then, implant the wafer in an implantation chamber as the wafer temperature is essentially between the second temperature and a third temperature, wherein the third temperature is higher than the second temperature and is an upper-limited temperature ($T_L$) which is allowable for the low temperature ion implantation step. Depending on the additional details of the implant process, the upper-limited temperature may be equal to, close to or visibly different than the second temperature. And then, transfer the implanted wafer into a load-lock chamber in a vacuum state at time of $t_h$, wherein the load-lock chamber has at least one atmosphere door as an interface between the load-lock chamber and outside environment, wherein the atmosphere door is closed when the load-lock chamber is in the vacuum state. Next, execute a vacuum venting process in the load-lock chamber, wherein the vacuum venting process proceeds at a time $t_v$. Sequentially, wait an extra time after the vacuum venting process until the wafer has a fourth temperature at time $t_f$, wherein the fourth temperature ($T_4$) is higher than the prescribed implant temperature ($T_P$) and the upper-limited temperature ($T_L$). And finally, open the atmosphere door and move the wafer outside the load-lock chamber. Herein, the upper-limited temperature ($T_L$) is assumed to be slightly higher than the prescribed implant temperature ($T_P$) and the wafer temperature variation is assumed to be linear, although that is immaterial to the main characteristics of this embodiment.

In this embodiment, the wafer contacts the air from the outside environment after the atmosphere door is opened. Clearly, the wafer has the fourth temperature being higher than the prescribed implant temperature ($T_P$) and the upper-limited temperature ($T_L$) before the atmosphere door is opened, and then the water condensation on the surface of the wafer may be minimized.

Moreover, during the vacuum venting process, a gas admitted into the load-lock chamber is a warm dry gas or heated nitrogen gas. Hence, after the vacuum venting process and before the opening of the atmosphere door, the wafer in the load lock chamber is surrounded by this gas so that the wafer temperature may be quickly raised. Note that the energy interchange mechanism between the gas surrounding the wafer and the wafer itself is significantly more efficient than the radiation mechanism between the vacuum environment surrounding the wafer and the wafer itself. Therefore, to induce same temperature increase, the required extra time by using the embodiment is significantly shorter than the required time by using the prior art that the wafer is heated by a radiation mechanism between the wafer and a vacuum environment in the load-lock chamber. Accordingly, the throughput of low temperature ion implantation may be further improved by the embodiments.

Moreover, as described in the above embodiments, to properly control the extra time, even the fourth temperature, a temperature measurement device is configured near the wafer to detect the wafer temperature, so that the temperature adjusting process may be stopped immediately when the required third temperature is arrived. The temperature measurement device may be chosen from a thermocouple, an infrared thermometer or a non-contact type temperature measurement device for minimizing any potential condensation.

Although the present invention has been explained in relation to its preferred embodiment, it is to be understood that other modifications and variations can be made without departing from the spirit and scope of the invention as hereafter claimed.

What is claimed is:

1. A method for low temperature ion implantation, the method comprising:
    a cooling process to cool a wafer, wherein a temperature adjustment device is operated in a first state to let a temperature of said wafer change from a first temperature to a second temperature;
    implanting said wafer in an implantation chamber, wherein a temperature adjustment device is operated in a second state to let the temperature of said wafer essentially be between said second temperature and a third temperature higher than said second temperature;
    transferring said implanted wafer into a load-lock chamber; and
    venting vacuum in said load-lock chamber and then moving said wafer outside said load-lock chamber.

2. The method for low temperature ion implantation according to claim 1, wherein said first temperature is room temperature and said second temperature is a prescribed implant temperature.

3. The method for low temperature ion implantation according to claim 1, wherein said third temperature is an upper-limited temperature which is allowable for said low temperature ion implantation.

4. The method for low temperature ion implantation according to claim 1, wherein said temperature adjustment device applies a gas to cool said wafer, said first state corresponding to a first pressure of said gas and said second state corresponding to a second pressure of said gas.

5. The method for low temperature ion implantation accordingly to claim 4, where said first pressure is higher than said second pressure.

6. The method for low temperature ion implantation according to claim 4, wherein said first pressure is a constant.

7. The method for low temperature ion implantation according to claim 4, wherein said first pressure is variable with time.

8. The method for low temperature ion implantation according to claim 1, wherein said temperature adjustment device is a temperature controlled chuck capable of holding said wafer, said first state corresponding to a first working temperature of said temperature controlled chuck and said second state corresponding to a second working temperature of said temperature controlled chuck.

9. The method for low temperature ion implantation according to claim 8, wherein said first working temperature is lower than said second working temperature.

10. The method for low temperature ion implantation according to claim 4, further comprising using an E-chuck to hold said wafer by imposing an electrostatic force to said wafer, wherein a voltage of said E-chuck is adjusted in response to a variation of said pressure of said gas to let an attracting force applied on said wafer dynamically balance with a pushing force applied on said wafer.

11. The method for low temperature ion implantation according to claim 10, wherein an electrostatic force from said E-chuck is increased when a pressure of said gas is increased.

12. The method for low temperature ion implantation according to claim 1, further comprising using a temperature measurement device to detect a temperature of said wafer.

13. The method for low temperature ion implantation according to claim 12, wherein said temperature measurement device is chosen from a group consisting of the following: a thermocouple, an infrared thermometer, a non-contact type temperature measuring device and combinations thereof.

14. A method for low temperature ion implantation, the method comprising:
   a cooling process to cool a wafer from a first temperature to a second temperature;
   implanting said wafer in an implantation chamber as a temperature of said wafer is essentially between said second temperature and a third temperature higher than said second temperature;
   transferring said implanted wafer into a load-lock chamber in a vacuum state, said load-lock chamber having at least an atmosphere door as an interface between said load-lock chamber and an outside environment, wherein said atmosphere door is closed when said load-lock chamber in said vacuum state;
   executing a vacuum venting process in said load-lock chamber;
   waiting an extra time after said vacuum venting process until said wafer has a fourth temperature higher than said third temperature; and
   opening said atmosphere door and moving said wafer outside said load-lock chamber.

15. The method for low temperature ion implantation according to claim 14, said first temperature being a room temperature, and said second temperature being a prescribed implant temperature.

16. The method for low temperature ion implantation according to claim 14, wherein said fourth temperature is close to said first temperature so that water condensation on a surface of said wafer is minimized when said atmosphere door is opened and air from said outside environment contacts with said surface of said wafer.

17. The method for low temperature ion implantation according to claim 14, wherein said third temperature is an upper-limited temperature which is allowable for said low temperature ion implantation.

18. The method for low temperature ion implantation according to claim 14, further comprising waiting an additional time after said implant process is finished and before said vacuum venting process is started.

19. The method for low temperature ion implantation according to claim 14, wherein a gas is admitted into said load-lock chamber to execute said vacuum venting process, said gas being chosen from a group consisting of the following: warm gas, dry gas, heated nitrogen gas and combinations thereof.

20. The method for low temperature ion implantation according to claim 14, further comprising using a temperature measurement device to detect a temperature of said wafer, wherein said temperature measurement device is chosen from a group consisting of the following: a thermocouple, an infrared thermometer, a non-contact type temperature measuring device and combinations thereof.

* * * * *